United States Patent [19]
Lin et al.

[11] Patent Number: 5,888,452
[45] Date of Patent: Mar. 30, 1999

[54] HYDROGENATED AMORPHOUS SILICON ALLOYS

[75] Inventors: Guang Hai Lin, Bryan; John O'M. Bockris, College Station; Muzhi He, Bryan, all of Tex.; Mridula Kapur, Tarragona, Spain

[73] Assignee: Electric Power Research Institute, Palo Alto, Calif.

[21] Appl. No.: 729,434

[22] Filed: Jul. 12, 1991

[51] Int. Cl.$^6$ ............................. C22C 29/18; C22C 16/00
[52] U.S. Cl. .................. 420/578; 136/258 AM; 148/403; 427/255; 427/255.2; 427/576; 427/578
[58] Field of Search ............................. 423/644; 427/576, 427/578, 585, 255.2, 255; 136/258 AM; 420/578, 903; 148/403

[56] References Cited

U.S. PATENT DOCUMENTS

| | | | |
|---|---|---|---|
| 4,431,562 | 2/1984 | Hiraki et al. | 423/347 |
| 4,522,663 | 6/1985 | Ovshinsky et al. | 420/578 |
| 4,902,579 | 2/1990 | Grasselli et al. | 423/644 |
| 5,114,770 | 5/1992 | Echizen et al. | 136/258 AM |

OTHER PUBLICATIONS

Muzhi He et al, "Amorphous Silicon Selenium Alloy Film Deposited Under Hydrogen Dilution," *Mat. Res. Soc. Symp. Proc.* vol. 219, (1991), Materials Research Society.

Lin, G.H. et al. *Appl. Phys. Lett* 57, 300–301 (1990).
P.K. Sufflebotham et al. *J. Non. Cryst. Solids,* 92 183 (1987).
F.G. Wakim, et al. *J. Non–Cryst. Solids,* 53 11 (1982).
P.K. Sufflebotham et al., *J. Appl. Phys.* 60, 2036 (1986).
Thompson & Reinhard, et al. *J. Non–Cryst. Solids,* 37, 325–333 (1980).
Le Xu & Foiles, et al. *ICAL Magazine,* B, 1 vol. 49, #3 (1984).
Wakim, et al. *Appl. Phys. Lett.,* 42, #6 15 (1983).
Andjuar, et al. *Solar Energy Materials,* 15, 167–173 (1987).
S. Al–Dallal, et al. *J. Non–Cryst. Solids,* 114, 789–791 (1989).
S. Aljishi, et al., *J. Non–Cryst. Solids,* 114, 462–464 (1989).
S. R. Ovshinsky *Physical Properties of Amorphous Materials* 105 (1985).

*Primary Examiner*—Wayne Langel
*Attorney, Agent, or Firm*—Flehr, Hohbach, Test, Albritton & Herbert

[57] ABSTRACT

Novel hydrogenated amorphous silicon alloys are disclosed. Hydrogenated amorphous silicon alloys produced by PECVD are disclosed. A method is also disclosed for the preparation of novel hydrogenated amorphous silicon alloys for use as thin films. The method comprises subjecting a mixed gas of gas-phase silicon compounds and other gas-phase alloy element compounds to plasma enhanced chemical vapor deposition in a reaction zone such that the alloy formed is deposited on a substrate.

47 Claims, 7 Drawing Sheets

HYDROGENATED AMORPHOUS SILICON ALLOYS

FIELD OF THE INVENTION

Novel hydrogenated amorphous silicon alloys, hydrogenated amorphous silicon alloys produced by PECVD, and methods for producing such alloys useful as thin semiconductive films.

BACKGROUND AND PRIOR ART

There has been widespread interest in the development of hydrogenated amorphous silicon alloys. Such alloys find application in a variety of devices, although their main application remains in tandem photovoltaic cells (J. M. Ogden, et al., *Report at Princeton University Center for Energy and Environmental Study*, 231 (February 1989)) and G. H. Lin, et al., *Appl. Phys Lett.* 55, 386 (1989). Such devices have the capability of producing efficient, economical, large-scale solar to electrical or chemical energy conversion (G. H. Lin, et al.,*Appl. Phys Lett.* 55, 386 (1989)).

However, a solar cell or other device employing an active semiconductor utilizes only a limited portion of the incident energy. For example, photon energy higher than the optical bandgap is not fully utilized and much is wasted as heat, while that lower than the bandgap is not absorbed. Thus, it is of great technological importance to discover semiconductor materials with optical bandgaps that differ from that of amorphous silicon, a substance commonly employed as semiconductor material. Alloying amorphous silicon with various other elements might result in beneficial optical bandgap energies as well as beneficial optical and electrical properties.

In the recent past, several groups have experimented with hydrogenated amorphous silicon alloys for use as semiconductor material. Hydrogenated amorphous silicon alloys have been mainly prepared with the Group IV elements. Thus, alloys such as a-Si:C:H, a-Si:Ge:H, and a-Si:Sn:H have been formed for study (where "a-" indicates amorphous; J. Chevallier, et al., *Sol. St. Commun.* 24, 867 (1977); K. D. MacKenzie, et al., *Phys. Rev. B*, 31, 2198 (1985); D. A. Anderson et al., *Phil. Mag.*, 35, 1 (1977); J. Tyczkowski *Thin Solid Films*, 168, 175 (1989); C. Verie, et al., *J. de Phys. Coll.* c4, 42, Supp. 10, 667 (1981); and D. Girginoudi, et al., *Appl. Phys.*, 66, 354 (1989)). Except for these materials, very few other amorphous silicon alloys have been characterized, the most widely studied being a-Si:N:H, a-Si:O:H and a-Si:F:H (P. K. Shufflebotham, et al., *J. Non. Cryst. Solids*, 92, 183 (1987)). Only preliminary results exist on the Group VI (Se, Te) amorphous silicon alloys (F. G. Wakin, et al., *J. Non-Cryst. Solid*, 53, 11 (1982) and P. K. Shufflebotham, et al., *J. Appl. Phys.*, 60, 2036 (1986)). The Group III alloys (Al, Ga) have not been prepared by the plasma enhanced chemical vapor deposition (PECVD) method (Shufflebotham, et al., supra). Very few tertiary or higher component alloys have been produced (Shufflebotham. et al., supra). For example, an a-Si(Al) alloy has been produced by subjecting polycrystalline silicon to rf sputtering in the presence of pure aluminum (Thompson and Reinhard, et al., *J. Non-Cryst. Solids*, 37, 325–333 (1980)). An a-Si(Ga) and a-Si(In) alloy have also been prepared by rf sputtering (Le Xu and Foiles, et al., *ICAL Magazine B.*, Vol. 49, #3, (1984)). Although an a-Si(Se) alloy has been prepared by a vacuum evaporation method (Wakim, et al., *Appl. Phys. Lett.*, 42, #6 (15 Mar. 1983)), this and the other alloys mentioned here are not hydrogenated, which is a beneficial aspect of the alloys of this invention. Additionally, a-Si:H,Al alloys were prepared by evaporating pure aluminum and subjecting it to dc glow discharge (Andujar,et al., *Solar Energy Materials*, 15, 167–173 (1987)); these alloys also exhibited virtually no hydrogen incorporation. And while PECVD has been used elsewhere to prepare a hydrogenated alloy (a-Si:S:H), the alloy formed and the method of preparation employed were distinctly different. (S. Al-Dallal, et. al., *Journal of Non-Crystalline Solids* 114, 789–791 (1989); S. Aljishi, et. al., *Journal of Non-Crystalline Solids* 114, 462–464 (1989)).

Research has centered around the study of the Group IV alloys because these elements closely resemble silicon in chemical properties and, therefore, are expected to readily substitute for silicon in the a-Si:H network, giving rise to high quality, defect-free alloys. However, factors such as disorder induced strain, (S. R. Ovshinsky, et al., *Mater. Res. Soc. Spring Meeting* San Francisco (1985)) preferential hydrogen bonding to certain elements (A. Morimoto, et al., *Jpn. J. Appl. Phys.* 20, L833 (1981)) differences in atomic size, etc., cause heterostructure silicon alloys to be formed. Where these factors come into play, the bonding configuration of the alloying Group IV element is quite different from the expected tetrahedral one. For example, Ge shows a tendency towards divalency in the a-Si:Ge:H alloys, (S. R. Ovshinsky *Physical Properties of Amorphous Materials* 105 (1985)) whereas carbon favors graphitic bonding in the high concentration a-Si:C:H alloys (T. Shimada, et al. *J. Appl. Phys.*, 50, 5530 (1979)).

Thus, to improve silicon alloy properties for use as semiconductor materials, it would be highly advantageous to form alloys of Group IV elements and alloys comprising other than the traditional Group IV elements.

Good candidates for amorphous silicon alloys are elements with bond lengths and bond strengths similar to silicon. Thus, Se, as well as a variety of other elements, are good candidates as alloys. For example, selenium was selected as a candidate for forming an amorphous silicon alloy because the bond lengths and bond strengths of the two elements are similar. The magnitude of both Si-Si and Se-Se bond lengths is 1.17 Å (F. A. Cotton, et al., *Basic Inorganic Chemistry* (Wiley, N.Y. 1976). The corresponding bond strength is $E_{Si-Si}$=78.1 kcal/mol (C. Chatillon, et al., *C. R. Acad. Sci. Ser. C*280 (1975) 1505 and $E_{Se-Se}$=79.5 kcal/mol (J. Drowart, et al. *J. Chem. Soc. Faraday Trans.* 2 72 (1977) 1755.

Another important reason for the selection of an element such as selenium as the alloying element is the possibility of forming a wide or narrow bandgap material. When exposed to photon energy much higher than its optical bandgap, an alloy with a narrow bandgap is unable to fully utilize this energy, and part of it is wasted as heat. Similarly, incident energy lower than the bandgap of an alloy with a narrow bandgap is not absorbed. Thus, it would be highly advantageous and commercially beneficial to discover alloys with wide or narrow bandgaps, which materials would utilize a broader range of incident energies.

Wakim et al. (F. G. Wakim, et al. *J. Non-Cryst. Solids* 53 (1982)) studied the photoelectronic properties of a-Si:Se alloys. The main conclusion of the study was that selenium has the same effect as that of hydrogen in a-Si:H, i.e., reducing the dangling bond density. The hydrogenated form of Si-Se alloys (a-Si:Se:H) has not yet been examined.

One very important feature of potential alloying components to be considered when preparing elements for use as thin films is whether the alloying component is available as a gas-phase compound (i.e., $H_2Se$). Using components in the gaseous form will allow better mixing of components, for alloys generally and for thin films specifically, and result in more homogeneous alloys and more homogeneous films when applied to an appropriate substrate. Thus, the alloying components contemplated by this invention are capable of being prepared as gas-phase alloy element compounds. This is a requirement for the selected alloy preparation method, i.e., plasma-enhanced chemical vapor deposition (PECVD). This technique is also known by the term "rf glow discharge." Other techniques that may be employed to form similar alloys (i.e., dc glow discharge, hot wire assisted CVD and electron cyclotron resonance plasma deposition) exist and also use gas-phase components.

With these considerations in mind, three new materials were selected for preparation as semiconductor alloys: a-Si:Se:H; a-Si:Al:C:H, and a-Si:Ga:C:H. These alloys were chosen because of the possibility they provide of forming both high and low energy gap materials.

SUMMARY OF THE INVENTION

This invention provides novel hydrogenated amorphous silicon alloys. The alloys of this invention have unusual optical bandgap properties when compared with amorphous silicon. Certain of the alloys have bandgaps in the range from about 1.0 electron volt (eV) to about 1.55 eV, and certain other alloys have bandgaps in the range from about 1.80 eV to greater than 2.1 eV.

The present invention also provides hydrogenated amorphous silicon alloys produced by subjecting a mixed gas comprising a gas-phase silicon compound and a gas-phase alloy element compound to plasma enhanced chemical vapor deposition (PECVD) in a reaction zone under suitable conditions.

A novel efficient method for preparing hydrogenated amorphous silicon alloys for use as thin semiconductive films has also been developed. The method involves forming a mixed gas comprising at least a gas-phase alloy element compound and a gas-phase silicon compound, and subjecting the mixed gas to plasma enhanced chemical vapor deposition (PECVD) in an environment such that alloys formed from the mixed gas are deposited on a suitable substrate to form a semiconductive film.

BRIEF DESCRIPTION OF THE DRAWINGS

FIG. 2 A typical EDS spectrum for a 10% (Al/Al+Si, gas phase ratio) amorphous aluminum alloy is shown. Films deposited on titanium substrate were examined. Because the films were less than half a micron in thickness, there was contribution from the substrate in the spectrum. The spectra were recorded at five random points on the film surface to determine the homogeneity of the film. It was determined that the Al was uniformly distributed. The elemental content of the films was obtained by quantifying the EPMA results. For all three alloys, the elemental concentration in the films was greater than that in the gas phase.

FIG. 3 A SIMS depth profile analysis of the amorphous silicon selenium alloy is shown. The spectrum reveals that the films contain only trace amounts (less than 0.4 at %) of C and O contaminants. In the spectrum, the oxygen and carbon signal intensities are observed to decrease towards the film bulk, accompanied by an increasing H content. The significant O signal at the alloy-substrate interface is due to the surface oxidation of the Ti substrate. The film thickness as determined from the SIMS spectrum, shows agreement with that measured by the profilometer.

DETAILED DESCRIPTION OF THE INVENTION

This invention provides novel hydrogenated amorphous silicon alloys of the form a-Si:M:R1 for use as thin semiconductive films or for other applications.

The silicon alloys of this invention will have the generic chemical structure: a-Si:M:R1. "a-" indicates that the alloy is amorphous in structure. In general, and as used throughout this application, the formula "Si:M:R1" indicates that components Si, M and R1 are present in the amorphous alloy; trace amounts of other elements are also present in the alloys.

Furthermore, the relative amount of each of these alloy components is given as an "atomic percent" (at. %) of the alloy. This is because the elements do not form discrete bonds as takes place in, for example, crystalline chemical structures. In the present case, the proportion of the components of the alloy (i.e., M and R1) are set forth in atomic percent, which is defined to be the percent of the atomic component in the alloy regardless of its chemical bonds or crystalline structure. Thus, preferred alloys of this invention are those in which M is present from about 0.25 at. % to about 30 at. % and R1 is present from about 1 at. % to about 40 at. %; the remaining atomic percentage is attributable to Si and some trace elements. The preferred alloys consist essentially of Si, M and R1, and less than or about 0.5 at. % of other components are present in the alloys.

"M" will be selected from the group of elements consisting of: Al, Ga, Se, B, P, As, Mg, Zn, Cd, Fe, and Ni, although other elements could also be useful, such as S, C, O, Sn and the like. "R1" represents a hydrogen atom (H), a fluorine atom (F), or the C:H component of the alloy. Thus, as mentioned above, where R1 is H, hydrogen will be present in the alloy from about 1 at. % to about 40 at. %, and where R1 is the "C:H" component, carbon and hydrogen atoms present in the alloy will total about 1 at. % to about 40 at. %

Thin films of this invention are films having a thickness in the range from about 0.10 $\mu$m to about 2.0 $\mu$m, although preferred thin films of this invention are in the range from about 0.5 $\mu$m to about 1.6 $\mu$m.

Suitable substrates for the deposition of thin films in the practice of this invention are well known in the field and include glass, conducting glass, quartz, stainless steel, aluminum foil, crystal silicon and titanium, although many other substrates, including plastic sheet, will be useful for the practice of this invention.

Alloys having optical bandgaps above or below the bandgaps exhibited by amorphous silicon are contemplated by this invention. Thus, alloys of this invention having bandgaps in the range from about 1.8 electron volts (eV) to above 2.1 eV are high bandgap materials. Alloys of this invention having bandgaps in the range from about 1.0 eV to about 1.55 eV are low bandgap materials. Alloys exhibiting bandgaps only slightly above or below those exhibited be amorphous silicon are also contemplated by this invention, and would by useful in the practice of this invention.

Thus, alloys of this invention have highly useful novel properties, including unusually low or unusually high bandgap energies, although alloys with bandgap energies in a range similar to that of known amorphous silicon may also be produced. For example, alloys disclosed in this invention exhibit bandgaps in the range from about 1.8 eV to greater than about 2.1 eV, whereas the pure amorphous silicon has a bandgap about 1.70 eV. Other alloys produced in this invention exhibit bandgaps of as low as 1.55 eV to 1.0 eV, far lower than amorphous silicon alloys currently available exhibit. Although the alloys disclosed in this invention exhibit bandgaps in ranges substantially different than that of currently available silicon alloys, alloys with bandgaps about 1.55 eV to about 1.8 eV may be produced by varying the ratio of gas-phase silicon to gas-phase alloy element compound. (See FIG. 4)

Alloys produced by the method of this invention may be formed by subjecting a mixed gas to plasma enhanced chemical vapor deposition (PECVD) in a reaction zone. The mixed gas will be comprised of at least two components: a gas-phase alloy element compound, and a gas-phase silicon compound. Thus, for example, the mixed gas may be formed by contacting one or more gas-phase alloy element compounds with one or both of silane and disilane.

The gas-phase alloy element compound is of the form: M:R2. In the preferred embodiments, M will be selected from the group of elements including Al, Ga, Se, B, P, As, Mg, Zn, Cd, Fe, and Ni, although other elements such as S, C, O, Sn and the like may also be used. R2 in this invention is a hydrogen atom (H) or a hydrocarbon derivative. (Thus, R2 differs from R1, in that R2 represents hydrocarbon derivatives in which the atoms have definite covalent bond relationships.) The hydrocarbon derivative may be CH, CH2, CH$_3$, (CH$_3$)$_x$, or (C$_2$H$_5$)$_x$, although many other hydrocarbon derivatives are useful for the practice of this invention. Thus, preferred gas-phase alloy element compounds of this invention include trimethyl aluminum, trimethyl gallium, triethyl aluminum, triethyl gallium and hydrogen selenide.

The preferred gas-phase silicon component of the mixed gas will be silane (SiH$_4$) or disilane (Si$_2$H$_6$), although other similar components may be used. For example, carbon-based alloys and germanium-based alloys may be prepared by the methods of this invention. Thus, in a preferred embodiment of this invention, a gas-phase alloy element compound will be mixed with silane or disilane to form a mixed gas, when is then introduced into the reaction area.

As practiced in this invention, a mixed gas will be subjected to PECVD in a reaction zone. The environment in the reaction zone during and before the reaction may be a typical mixture of reactant gases. However, the alloys of this invention may be prepared by the PECVD reaction under other gas environments. Thus, the reaction zone environment may be substantially enriched in a third gas, such as hydrogen, fluorine, an inert gas (i.e., He, Ne, A, Kr, Xe, and Rn) or a mixture of inert gasses or other gasses. Thus, for example, the mixed gas may be introduced into the reaction zone which has a substantially hydrogen-rich environment, or a substantially fluorine-rich environment, and the mixed gas will then react, for example, in a hydrogen-enriched or fluorine-enriched environment.

The mixed gas will be formed from its component gasses, i.e., gas-phase alloy element compounds and gas-phase silicon compounds, in the reaction zone, or will be formed from its components before introduction into the reaction zone; either procedure will be useful with this invention. Similarly, if a third gas is used, the mixed gas and a third gas may be mixed and added to the reaction at the same time. If gases introduced into the reaction zone together are the mixed gas and hydrogen, in the preferred embodiment the ratio will be at least 5 parts hydrogen to 1 part mixed gas. Otherwise, the third gas may be added first, or the mixed gas may be added first. The mixed gas may be held at ambient temperature, or it may be heated or cooled and held at about such heated or cooled temperature as the PECVD reaction begins.

The reaction zone will be a space where pressures above or below atmospheric pressure can be maintained before and during the PECVD reaction. For example, before the mixed gas or mixed gas components are introduced into the reaction zone, the initial pressure in the reaction zone may be held at from about $10^{-8}$ Torr to about $10^{-5}$ Torr. And, for example, after the mixed gas or mixed gas components are introduced into the reaction zone, the reaction pressure may be held from about 200 mTorr to about 1800 mTorr. In a preferred embodiment of this invention, the initial pressure may be held at about $10^{-7}$ Torr, and the reaction pressure may be held at about 500 mTorr to about 700 mTorr.

One highly beneficial aspect of the present invention is the use of PECVD to deposit the hydrogenated amorphous silicon alloy as a thin film on a substrate. Alloys disclosed here have highly useful properties; they provide more uniform thin films and they have enhanced beneficial optical and electronic properties. Suitable substrates of the present invention include glass, conducting glass, quartz, stainless steel, aluminum foil, crystal silicon and titanium, although many other substrates, including plastic sheet, are also useful. The substrate temperature will be in the range from about 150° C. to about 450° C. In the preferred embodiment, the substrate temperatures will be in the range from about 225° C. to about 375° C.

The rf power density upon the substrate during PECVD is also significant for the practice of this invention. An additional and highly significant advantage of producing alloys of this invention by this PECVD method is that it is possible to scale-up to form uniform thin layers on much larger surface areas than is currently available. Thus, rf power densities for laboratory uses of this invention will be in the range of about 0.1 watts per centimeter squared ($W/cm^2$), whereas scale-up for industrial use of this invention may employ rf power densities in the range of about 10 $W/cm^2$ or more. In the preferred embodiment, the rf power density is in the range of about 0.1 $W/cm^2$.

This invention also discloses a method for producing hydrogenated amorphous silicon alloys of structure a-Si:M:R1 for use as thin semiconductive film. The method comprises forming a mixed gas from at least a gas-phase alloy element compound of the structure M:R and a gas-phase silicon compound, and subjecting the mixed gas to PECVD in a reaction zone such that the alloy formed thereby is deposited as a thin semiconductive film on a substrate. The reaction zone may be enriched in a third gas as the PECVD reaction takes place.

As described above, the silicon alloys of this invention will have the generic chemical structure: a-Si:M:R1. "a-" indicates that the alloy is amorphous. "M" will be selected from the group of elements consisting of: Al, Ga, Se, B, P, As, Mg, Zn, Cd, Fe, and Ni, although other elements could also be useful, such as S, C, O, Sn and the like. "R1" represents a hydrogen atom (H), a fluorine atom (F), or the C:H component.

Alloys prepared by the method of this invention can be prepared as thin films, which have heretofore unattainable levels of homogeneity, have a relatively low level of defects, and have enhanced beneficial optical and electronic properties.

Alloys produced herein by this PECVD method will be prepared from component elements in their gas phase, as described above, although alloys of this type may be prepared from solid-phase starting materials. rf sputtering and related techniques have been used to produce amorphous silicon alloys; however, little or no hydrogen was incorporated into those alloys. Alloys produced by these alternative methods do not exhibit the useful and beneficial properties of hydrogenated alloys produced by the method of this invention.

Further, these other methods commonly use solid-phase elements as starting materials, such as pure aluminum and pure selenium. In the preferred embodiment, PECVD as practiced in this invention uses all gas-phase starting materials. It was thought that use of gas-phase materials would allow better mixing of the components and that more homogeneous thin films would be produced. This was confirmed by analysis of the thin films of alloys produced by this method.

As practiced in this invention, a mixed gas will be subjected to PECVD in a reaction zone. The environment in the reaction zone during and before the reaction may be a typical mixture of reactant gases. However, the alloys similar to the alloys of this invention may be prepared by the PECVD reaction under other gas environments. (S. Al-Dallal, et. al., *Journal of Non-Crystalline Solids* 114, 789–791 (1989); S. Aljishi, et. al., *Journal of Non-Crystalline Solids* 114, 462–464 (1989)). Thus, the reaction zone environment may be substantially enriched in a third gas such as hydrogen, fluorine, an inert gas or a mixture of inert gasses or other gasses. Thus, for example, the mixed gas may be introduced into the reaction zone which has a hydrogen-enriched environment, or a substantially fluorine-enriched environment, and the mixed gas will then react in a hydrogen-enriched or fluorine-enriched environment. In the preferred embodiment the mixed gas is introduced along with hydrogen into the reaction zone in a ratio of at least 5 parts hydrogen to 1 part mixed gas.

Using the method of this invention, the mixed gas will be formed from its component gasses, i.e., gas-phase alloy element compounds and gas-phase silicon compounds, in the reaction zone, or will be formed from its components before introduction into the reaction zone; either procedure will be useful with this invention. Similarly, if a third gas is used, the mixed gas and the third gas may be mixed and added to the reaction at the same time; in the preferred embodiment the ratio is at least 5 parts hydrogen (the third gas) to 1 part mixed gas. Otherwise, the third gas may be added first, or the mixed gas may be added first.

Post-deposition techniques, such as annealing, will also have beneficial effects on the properties of thin films comprising the alloys.

The following examples illustrate specific embodiments of the present invention.

EXAMPLE 1

The alloy films were deposited on a suitable substrate in a capacitively coupled, parallel plate reactor by the PECVD method. A radio frequency (rf) field was used to generate the plasma. The reactants used were silane (Matheson, Semi-conductor purity), trimethyl aluminum (Alfa Products, 99.9995%), trimethyl gallium (Alfa Products, 99.9995%) hydrogen sulfide (Scott Specialty Gasses, 99.99%), and hydrogen selenide (Matheson, 98.0%). The films were deposited on Corning 7059 glass, titanium and polished single crystal silicon substrates.

Typical deposition conditions were as follows: base pressure prior to film deposition was $10^{-7}$ torr; substrate temperature was in the range from 250° C. to 270° C.; reactant gas pressure was between 500–700 mTorr; rf power density was approximately 0.10 $W/cm^2$; the gas flow rate was adjusted according to the concentration of alloy being prepared. For example, the flow rate of silane was maintained at 20 standard cubic centimeters per minute (sccm). On the other hand, the hydrogen selenide flow rate was adjusted in the range from 0.5% to 5% (gas phase ratio), according to the desired alloy composition. Alloys in the concentration range (gas phase ratio) 0.25–30% were prepared. The reaction chamber was evacuated by a turbomolecular pump. The base pressure prior to film deposition was about $10^{-7}$ Torr. At the time of film deposition, the chamber pressure was approximately 500 mTorr.

The film thickness was determined by an alpha step profilometer (Tencor Instruments, Model No. 10-00020). The optical absorption and transmission spectra of the different alloy films were recorded with a double beam Perkin-Elmer 3B UV-VIS Spectrometer. The bandgap energy of the alloys was determined by the standard Tauc plot method (J. Tauc, et al., *Phys. Status Solidi* 15 (1966) 627). Co-planar aluminum contacts were evaporated on the alloy films for the light and dark conductivity measurements. The photoconductivity was determined by illuminating the films with white light of 100 mW/cm² intensity.

The elemental composition of the alloy films was examined by energy dispersive X-ray spectroscopy analysis (EDS), and by electron microprobe analysis (EPMA), secondary ion mass spectroscopy (SIMS) and electron spin resonance (ESR) techniques. The EDS analysis was performed with a TN-2000 attachment on a JEOL JSM-3SCF scanning electron microscope, while the EPMA study was carried out on a Cameca MBX instrument, equipped with a wavelength dispersive spectrometer, at the typical electron beam energy of 10 keV. The results were quantified by comparison with suitable standards. The SIMS analysis was carried out on a Cameca IMS-3f instrument, operating in the ion probe mode. $Cs^+$ primary ions with 14.5 keV energy were rastered over a 250 μm×250 μm sample area. The elemental compositions of the films were determined from the negative secondary ions collected from an analyzed area of 8 μm diameter positioned in the center of the rastered area.

Figure 1:
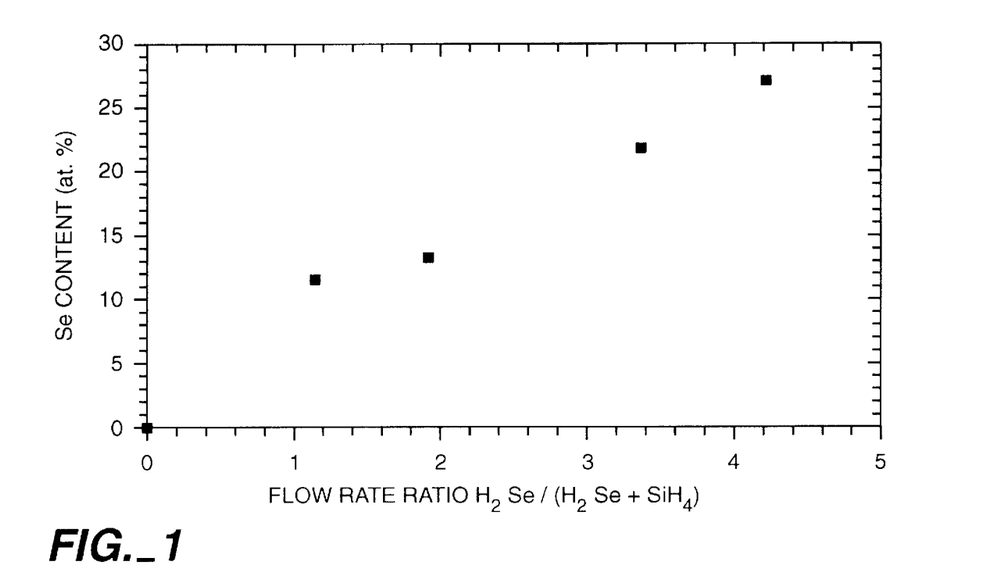
FIG. 1 The bulk elemental composition of amorphous silicon selenium alloy films was determined by EDS and EPMA measurements. The relation between film composition and gas phase flow ratio is shown. The selenium concentration in the film was much higher than that determined from the gas phase ratio. An almost linear variation of the Se film content with the gas phase ratio was obtained. For films deposited from reactant gas ratio [$H_2Se/H_2Se+SiH_4$] in the range from 1.2 atomic percent (at. %) to 4.2 at. %, the corresponding selenium content lay between 11.6 at. % and 27.1 at. %.

The relation between film composition and gas phase flow ratio for silicon-selenium alloy is shown in FIG. 1. It was observed that the selenium concentration in the film was much higher than that determined from the gas phase ratio. An almost linear variation of the Se film content with the gas phase ratio was obtained. For films deposited from reactant gas ratio $[H_2Se/H_2Se+SiH_4]$ in the range from 1.2% to 4.2%, the corresponding selenium content lay between 11.6 at. % and 27.1 at. %.

Figure 2:
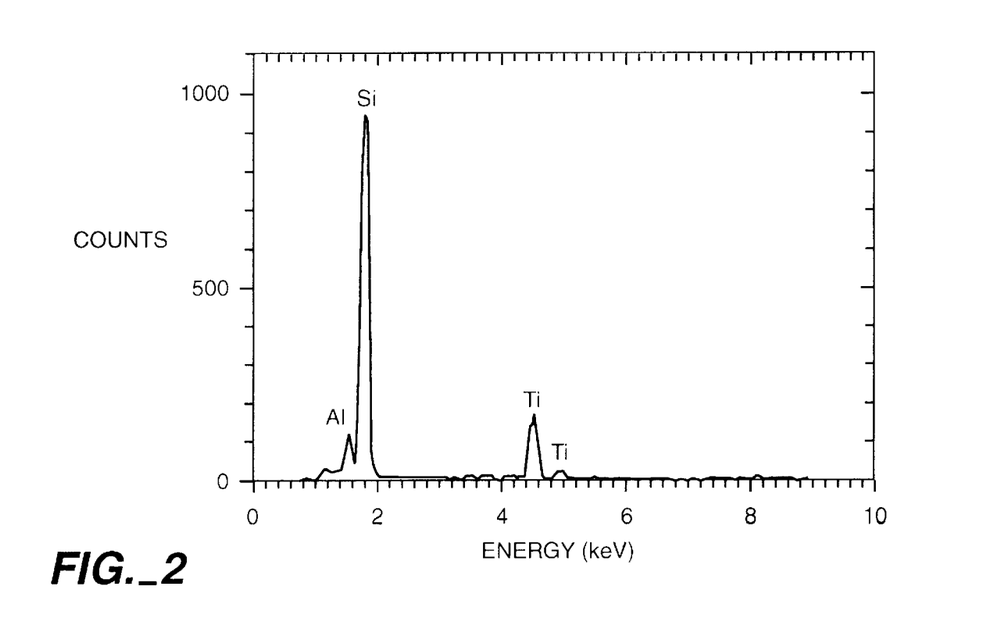
Figure 3:
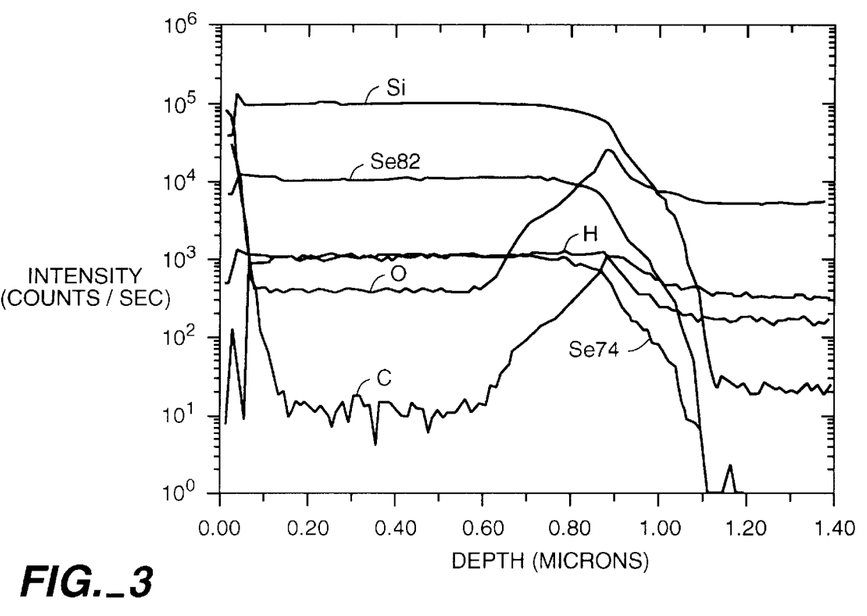

A typical EDS spectrum for a 10% (Al/Al+Si, gas phase ratio) amorphous aluminum alloy is shown in FIG. 2. Films deposited on titanium substrate were examined and as the films were less than half a micron in thickness, there was contribution from the substrate in the spectrum. The spectra were recorded at five random points on the film surface to determine the homogeneity of the film. It was determined that the Al was uniformly distributed. The elemental content of the films was obtained by quantifying the EPMA results. For all alloys, the elemental concentration in the films was greater than that in the gas phase. The SIMS depth profile analysis of the amorphous silicon selenium alloy is shown in FIG. 3. The spectrum reveals that the films contain only trace amounts (less than 0.4 at. %) of C and O contaminants. In the spectrum, the oxygen and carbon signal intensities are observed to decrease towards the film bulk, accompanied by an increasing H content. The significant O signal at the alloy-substrate interface is due to the surface oxidation of the Ti substrate. The film thickness as determined from the SIMS spectrum, shows agreement with that measured by the profilometer.

Figure 4:
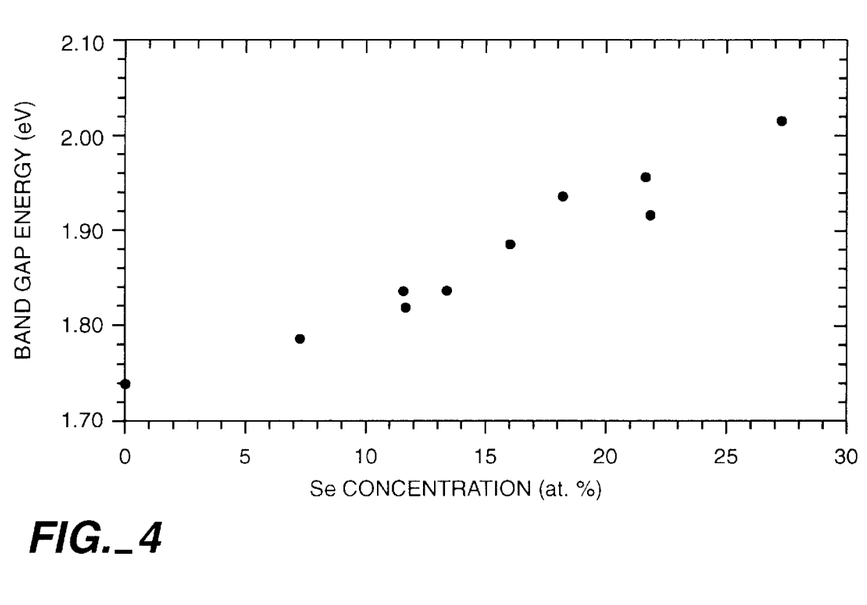
FIG. 4 This figure shows the variation of optical band gap energy as a function of composition for the a-Si:Se:H alloys. The band gap energy increased from 1.74 eV for a pure a-Si:H film to 2.01 eV for a film containing 27.1 at. % selenium.

The optical absorption spectra of the various amorphous silicon-selenium alloy films were obtained in the 400–900 nm wavelength. The absorption coefficient, α, was calculated from the absorbance and thickness data. The standard Tauc plots for different compositions of the a-Si:Se:H alloy were used to determine the optical bandgap, $E_g$. The selenium content was varied in the range from 0 at. % to 30 at. %. FIG. 4 shows the variation of optical bandgap energy as a function of composition for the a-Si:Se:H alloys. The bandgap energy increased from 1.74 eV for a pure a-Si:H film to 2.01 eV for a film containing 27.1 at. % selenium. Thus, the energy gap of a-Si:H was increased by alloying with Se.

Figure 5:
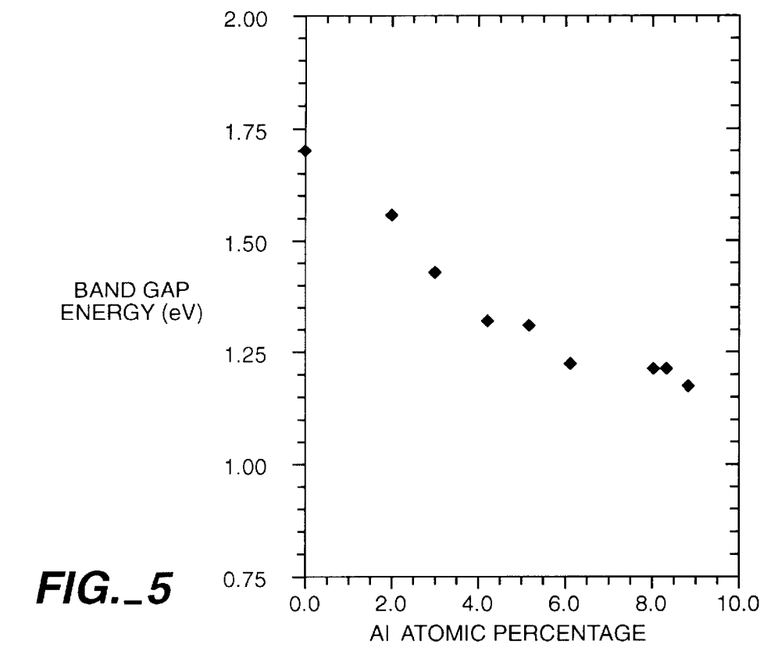
FIG. 5 Alloying Si with Al and Ga produced low bandgap materials in both cases. For the lowest concentration alloy, i.e., 2 at. % Al, a bandgap value of 1.55 eV was obtained. On increasing the concentration to 8.3 at. % of Al, the bandgap value decreased to 1.12 eV.
Figure 6:
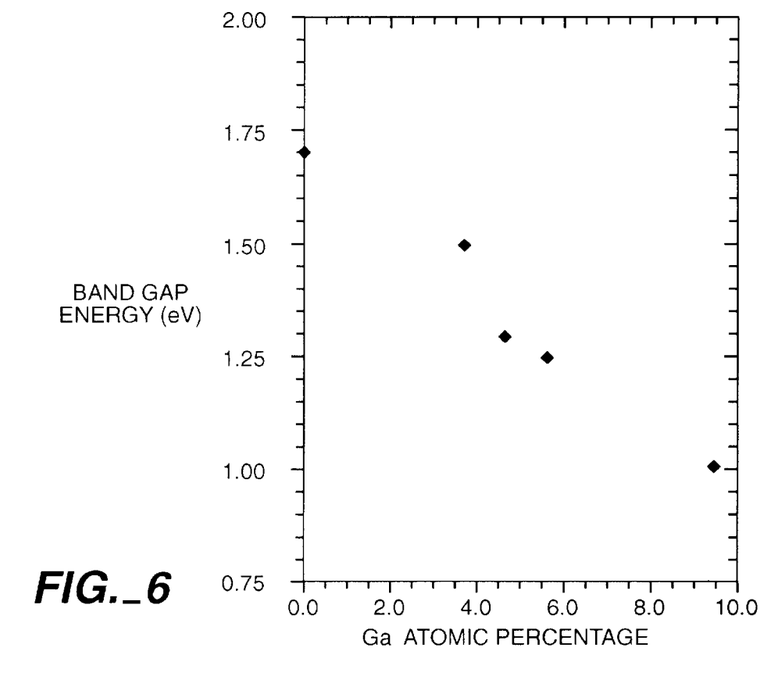
FIG. 6 For the a-Si:Ga:H alloys, a similar decrease, in the energy gap was observed on variation of the concentration. For a film content of 3.8 at. % Ga, the bandgap value was 1.42 eV, whereas with 9.6 at. % alloy, the energy gap obtained was 1.00 eV.

Alloying Si with Al and Ga produced low bandgap materials in both cases. For the lowest concentration alloy, i.e., 2 at. % Al, a bandgap value of 1.55 eV was obtained. On increasing the concentration to 8.3 at. % of Al, the bandgap value decreased to 1.12 eV (FIG. 5). For the a-Si:Ga:H alloys, a similar decrease (FIG. 6), in the energy gap was observed on variation of the concentration. For a film content of 3.8 at. % Ga, the bandgap value was 1.42 eV, whereas with 9.6 at. % alloy, the energy gap obtained was 1.00 eV.

The nature of the variation in optical energy gap on alloying amorphous silicon with Se, Al, Ga can be correlated to the energy of the bond formed between silicon and the alloying element. The bandgap is directly proportional to the Si-M bond strength (M=alloying element). Thus, for an alloy with Si-M bond energy greater than that of the Si-Si bond (e.g., Si-Se), the bandgap is greater than that of a-Si:H and vice versa.

Figure 7:
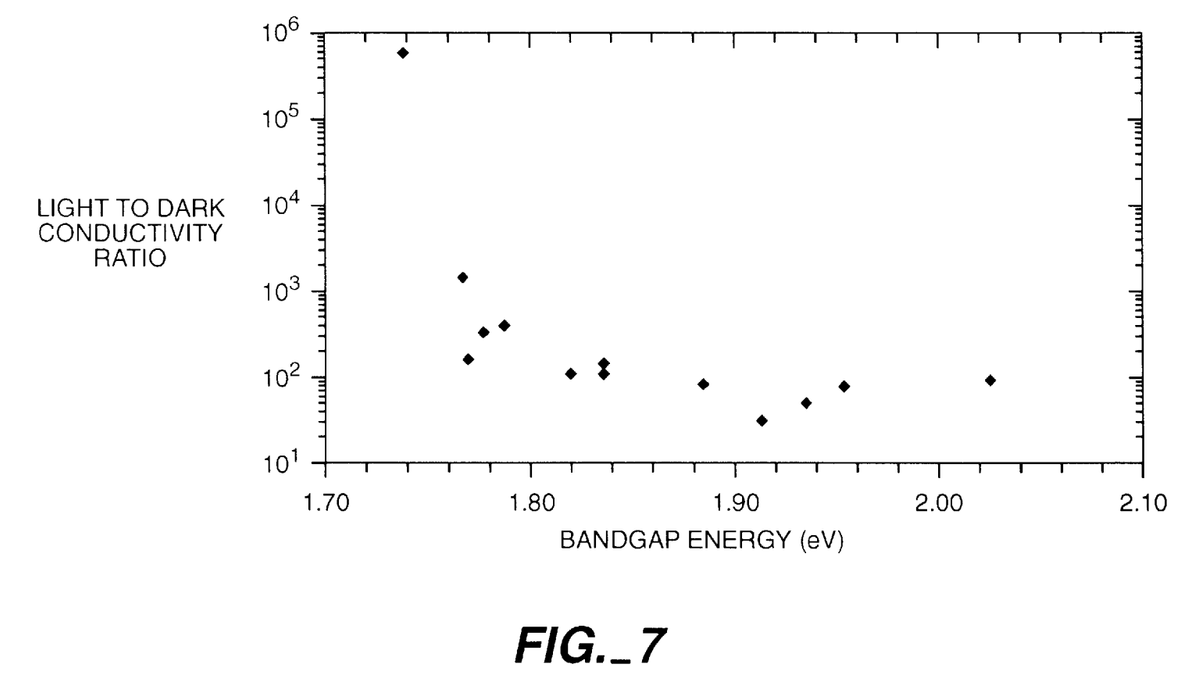
FIG. 7 The light to dark conductivity ratios for different composition of Si-Se alloys are shown. The photo response was measured under white light illumination of intensity 100 $mW/cm^2$. The corresponding datapoint for a pure amorphous silicon film ($E_g$=1.74 eV) is also shown.

The photoresponse was measured under white light illumination of intensity 100 mW/cm². The light to dark conductivity ratios for different composition of Si-Se alloys are shown in FIG. 7. The corresponding datapoint for a pure amorphous silicon film ($E_g$=1.74 eV) is also shown in the figure. Although the photoresponse of the alloy films was less than that of a-Si:H, very promising results were obtained with the a-Si:Se:H alloys. A change in the magnitude of light to dark conductivity ratio of three orders of magnitude was recorded.

The number density of dangling bonds in the alloys was estimated from electron spin resonance (ESR) measurements. The amorphous silicon alloy films used for the ESR experiment were deposited on quartz substrates.

The magnetic field was set at 3300 G. The microwave frequency was around 9 GHz, and the modulation frequency was 100 kHz. The experiment was performed at liquid nitrogen temperature. The resulting signal was compared with that obtained, under identical experimental conditions, for a standard p-type single crystal silicon sample with known spin number. The comparison did not take into account differences in dielectric properties of film on quarts substrates and single crystal silicon. The results are shown in Table I for the a-Si:Se:H and a-Si:H films.

The relative error of ESR data was about ±6%. For the film with poor photoresponse (light to dark conductivity ratio $<10^3$), the reduction of the ratio was attributed to an increase in the number of dangling bonds. However, for the films with light to dark conductivity ratio $>10^3$, the values of number density of the dangling bonds were close to that of amorphous silicon film. Thus, the reduction of the photoresponse was caused by the increase of structure defects. The ESR results also indicated that selenium atom may be a good dangling bond terminator (F. A. Cotton, et al. *Basic Inorganic Chemistry* (Wiley, N.Y. 1976)).

The photoresponse of the various alloy films is shown in Table II. Although, the photoresponse of the alloy films is less than that of a-Si:H, promising results are obtained with the a-Si:Se:H alloy, which shows a $10^2$–$10^3$ change in the light to dark conductivity ratio. The decrease of the photoresponse with increasing Se content was attributed to an increase of the density of defects in the films.

EXAMPLE 2

Amorphous silicon selenium alloy films were deposited in a two chamber system by PECVD method using hydrogen dilution. Rf power with frequency 13.6 MHz was capacitively coupled into the reaction chamber of a parallel plate reactor. A grounded stainless steel mesh was used as an electrostatic shield surrounding the reactor which confined the rf plasma between the two electrodes. The spacing between the two electrodes is 1.4 cm. The typical rf power density in the film deposition is 0.10 W/cm$^2$. The base pressure of the reaction chamber prior to film deposition was lower than 10$^{-7}$ torr. Substrates were heated by a disc heater to the designated temperature.

The silane flow rate and hydrogen flow rate were maintained at 13.5 sccm and 108 sccm respectively. The gas phase flow ratio of hydrogen selenide to silane, however, was adjusted in the range from 0.5% to 6%, according to the desired alloy composition.

Figure 8:
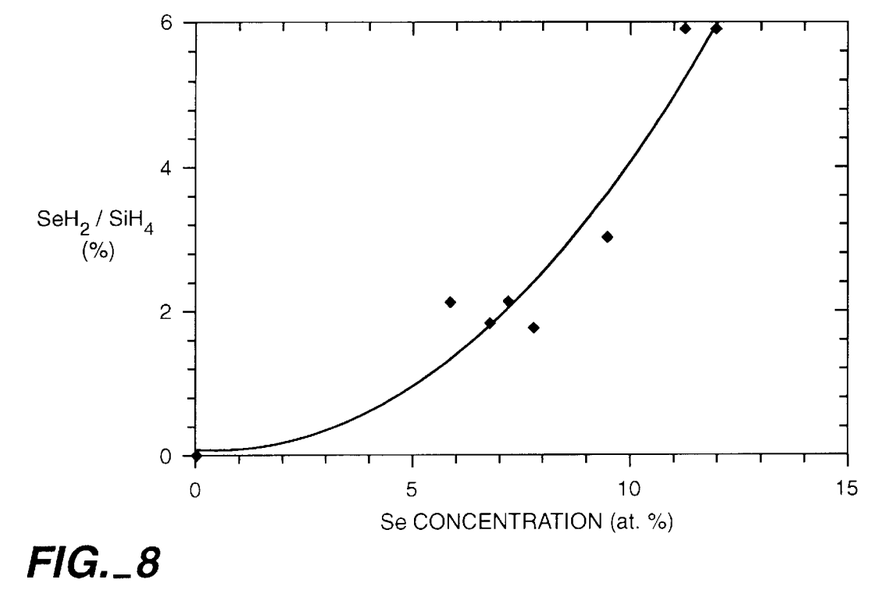
FIG. 8 The relation between gas phase flow rate ratio ($SeH_2/SiH_4$) and Se concentration in the film is shown. The Se concentration in the film is higher than that determined from the gas phase ratio: when gas phase flow rate ratio was 6%, the Se concentration in the film attained 12%.

The elemental composition of amorphous silicon selenium alloy films was determined by the electron probe microscopic analysis (EMPA) and energy dispersive X-rays spectroscopy (EDS). The EPMA results were quantified by comparison with suitable standards. The deviation of the EPMA results at different points of the film was less than 5%, which implies that the distribution of selenium atom in the film was uniform. The relation between gas phase flow rate ratio (SeH$_2$/SiH$_4$) and Se concentration in the film is shown in FIG. 8. The Se concentration in the film is higher than that determined from the gas phase flow ratio: when gas phase flow rate ratio was 6%, the Se concentration in the film attained 12%.

The optical absorption and transmission spectra of the alloy films were recorded by a double beam UV-Vis Spectrophotometer. Film thickness d and refractive index n($\lambda$) were calculated from the transmission spectrum in the wavelengths range of 500–900 nm. The optical bandgap energy, E$_g$, of a-Si:Se:H alloy was determined from the absorbance spectrum in the strong bsorption zone by Tauc formula (Tauc, et al., supra).

Amorphous silicon selenium alloy is a wider optical bandgap material. An almost linear relation between optical bandgap and Se concentration in the film was obtained. The bandgap energy E$_g$ increased from 1.74 eV for a pure amorphous silicon film to 1.87 eV as the alloy film containing 12 at. % of selenium.

Co-planar aluminum electrodes were vacuum evaporated onto the alloy film to make electrical contacts for dark and photoconductivity measurements. The typical spacing of the aluminum electrodes was 3 mm.

The photoresponse of the alloy films was measured under 100 mW/cm$^2$ white light illumination. The white light intensity was calibrated by a Spectra photometer with a set of optical neutral density filters. Prior to photoconductivity measurements, the film was annealed at 200° C. for about 20 minutes in a dark vacuum chamber.

Film defects were detected by measuring the Urbach tail energy and dangling bond density. The number density of dangling bonds in the amorphous silicon selenium films was measured by means of electron spin resonance (ESR) measurements. The alloy film prepared on quarts substrate was immersed in a magnetic field at the liquid nitrogen temperature. The microwave frequency, around 9 GHz, was adjusted so that the spin resonance signal of the alloy sample attained a maximum value. The electron spin resonance signal was obtained by scanning the magnetic field from 2900 G to 3700 G. The measured ESR signals were then compared to that of a standard p-type single crystal silicon sample, with a known total spin number, measured under identical experiment conditions as that of alloy films.

SPRS experiment was measured in a wavelength region from 600 nm to 1500 nm. The sample was illuminated by monochromatic light provided by a 600 lines/mm grating. A long pass optical filter was used to cut off the secondary harmonic oscillation generated from the grating. Monochromatic light intensity was measured by a germanium photo sensor with a known spectral response. The recorded photo current response of the alloy film at different wavelengths was normalized by total incident photon number flux.

Figure 9:
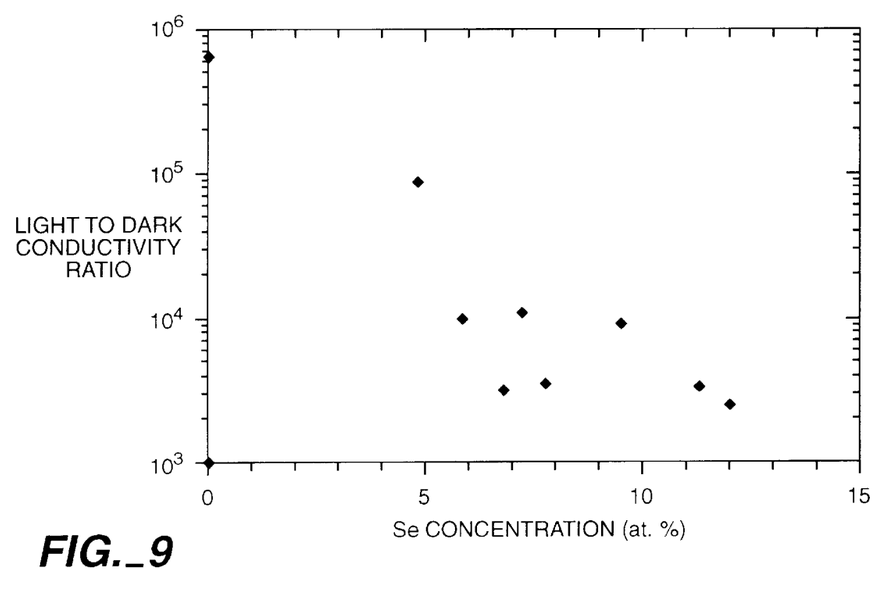
FIG. 9 The light to dark conductivity ratio for different composition of amorphous silicon selenium alloy film are shown. The pure amorphous silicon film data is also listed in the figure for comparison. Changes in the magnitude of light to dark conductivity ration from $10^3$ to $10^5$ were recorded, which indicated good film quality in the Si-Se alloy.

The light to dark conductivity ratio for different composition of amorphous silicon selenium alloy film are shown in FIG. 9. The pure amorphous silicon film data is also listed in the figure for comparison. Changes in the magnitude of light to dark conductivity ration from 10$^3$ to 10$^5$ were recorded, which indicated good film quality in the a-Si:Se:H alloy.

Figure 10:
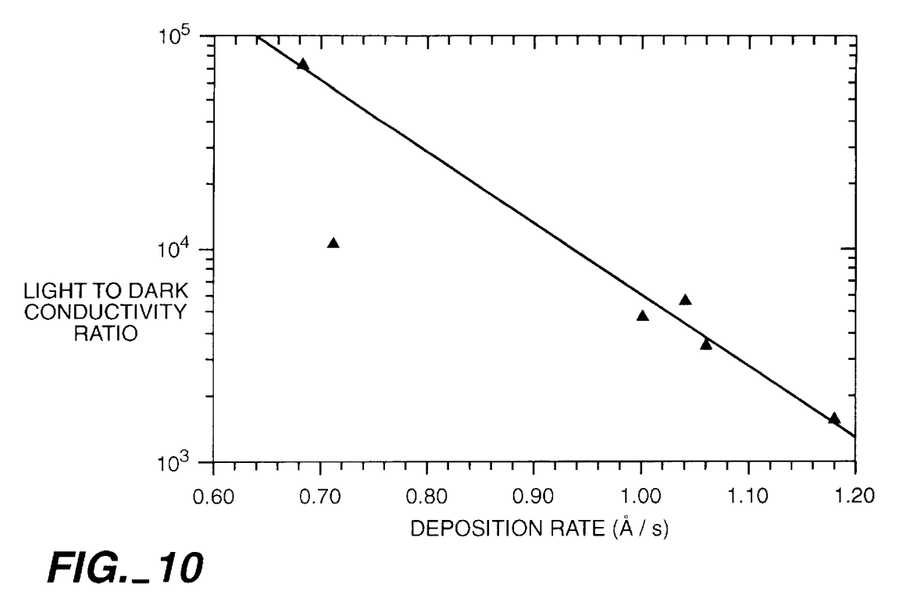
FIG. 10 The light to dark conductivity ratio as a function of deposition rate is shown. It decreased as the film deposition rate increased. The films with best quality were prepared at the deposition rate around or less than 1 Å/s.

Deposition rate is an important parameter which is directly related to film quality. The light to dark conductivity ratio as a function of deposition rate is shown in FIG. 10. It decreased as the film deposition rate increased. The films with best quality were prepared at the deposition rate around or less than 1 Å/s. The substrate temperature and gas pressure in the reaction chamber during the film deposition were also varied to optimize the film quality. The optimum substrate temperature was around 340° C. and the gas pressure prior to rf discharge was 660 mtorr for the selenium alloy film deposition with hydrogen dilution.

Figure 11:
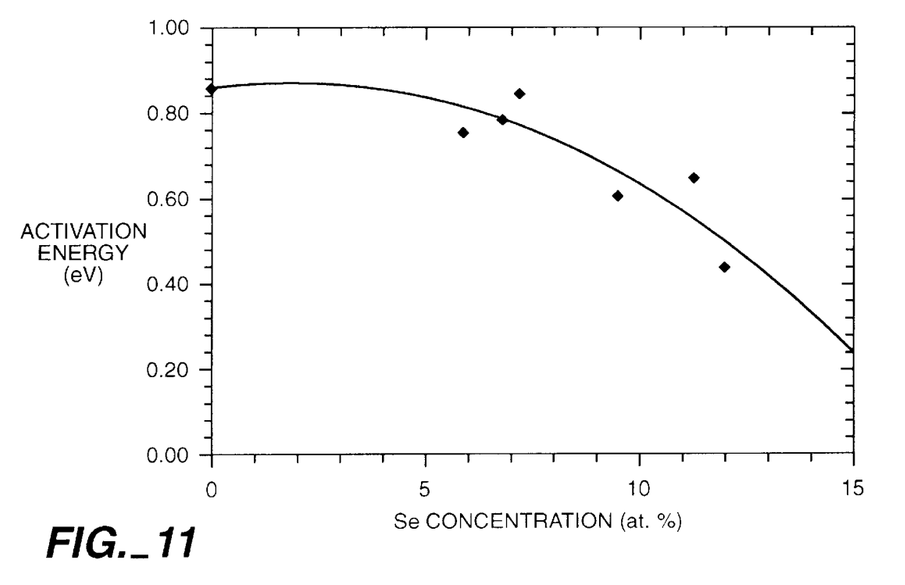
FIG. 11 The activation energy as a function of selenium concentration is shown. The thermal activation energy is about half of optical bandgap energy for amorphous silicon film. However, $E_A$ decreased in the alloy film as the Se concentration increased.

The dark conductivity $\sigma$ was measured as a function of temperature T in a vacuum system. The slope of the linear part in the figure of the dark conductivity vs. 1000/T was used to calculate the thermal activation energy E$_A$. The activation energy as a function of selenium concentration is shown in FIG. 11. The thermal activation energy is about half of optical bandgap energy for amorphous silicon film. However, E$_A$ decreased in the alloy film as the Se concentration increased. A possible explanation is that the a-Si:Se:H alloy semiconductor became more "n type" as the Se content in the film increases.

The ESR results indicated that the number density of the dangling bonds of the alloy film was close to that of amorphous silicon thin film. It seems reasonable to conclude that the dangling bonds in the alloy film were terminated by the selenium atoms.

The Urbach tail energy, E$_0$, was calculated from the transmission spectrum at the sub-bandgap region. It was found that films with higher light to dark conductivity ratio correspond to those having a lower Urbach tail energy.

Figure 12:
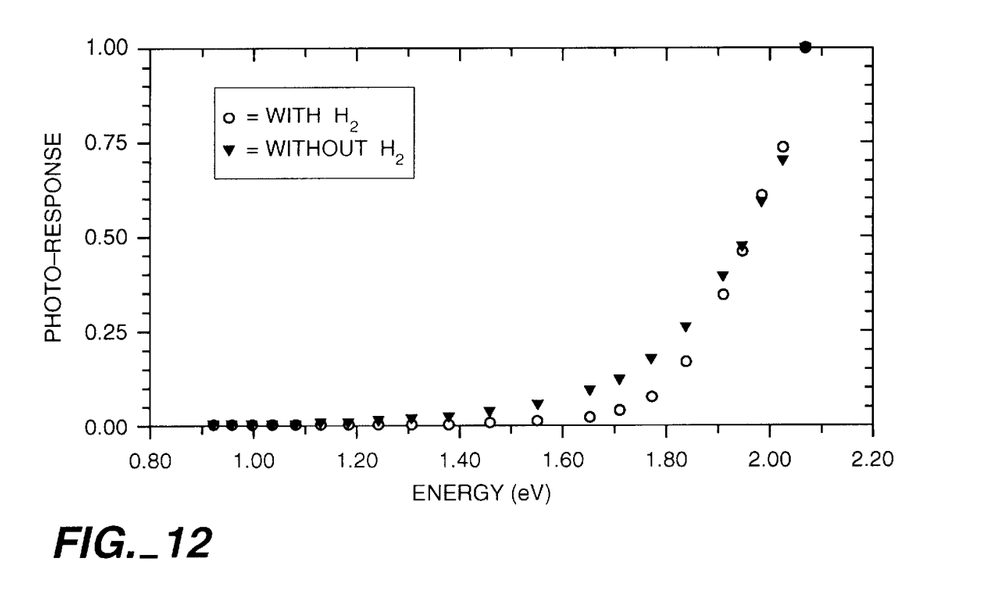
FIG. 12 The SPRS spectra of the films deposited with and without hydrogen dilution are shown. The spectrum consists of two sections, a linear part and an exponential part. The intersection of the linear part of the spectrum with the energy axis corresponds to the optical energy bandgap.

The SPRS spectra of the films deposited with and without hydrogen dilution are shown in FIG. 12. The spectrum consists of two sections, a linear part and an exponential part. The intersection of the linear part of the spectrum with the energy axis corresponds to the optical energy bandgap. The films were chosen so that the bandgap energy of the two films are almost the same. The area covered by the exponential part of the spectrum represented the structural defects. As the figure shows, the film with hydrogen addition had a smaller exponential part, and thus the structural defects were reduced by depositing the alloy in the hydrogen environment.

Figure 13:
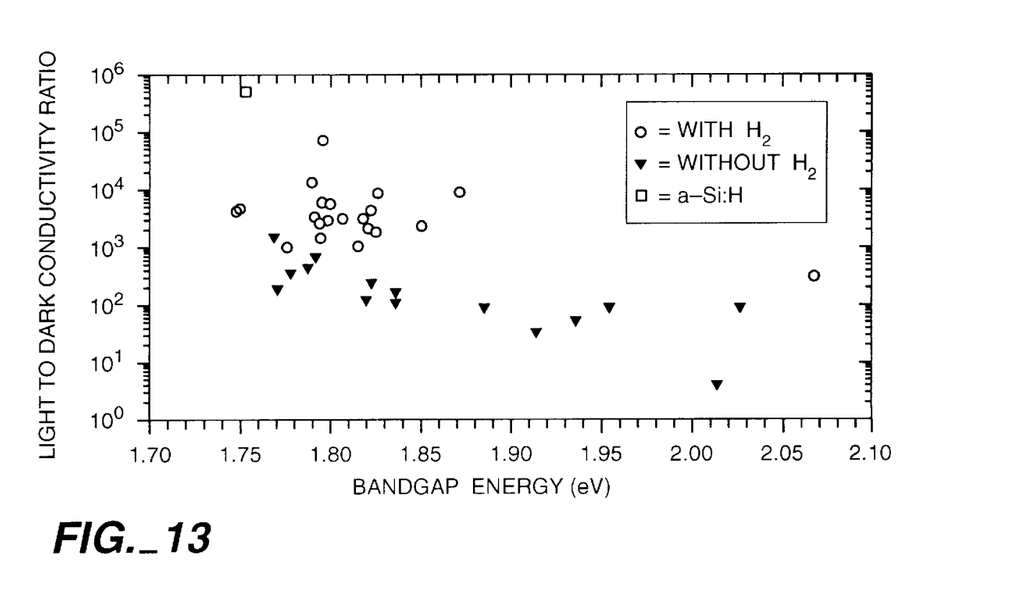
FIG. 13 This figure shows the light to dark conductivity ratio as a function of optical bandgap energy for both the alloy films. It was shown that the conductivity ratio of silicon selenium alloy prepared with hydrogen dilution, on the average, was one order of magnitude higher than those without hydrogen addition.

The film quality of the selenium alloys, prepared with $H_2$ dilution, is improved compared to those of Se alloy deposited without hydrogen dilution. FIG. 13 shows the light to dark conductivity ratio as a function of optical bandgap energy for both the alloy films. It was shown that the conductivity ratio of silicon selenium alloy prepared with hydrogen dilution, on the average, was one order of magnitude higher than those without hydrogen addition.

TABLE I

| | Dangling bond density ($cm^{-3}$) | Light to dark conductivity ratio |
|---|---|---|
| a-Si:H | $6.7 \times 10^{16}$ | $3.3 \times 10^5$ |
| | $6.9 \times 10^{16}$ | $1.4 \times 10^3$ |
| a-Si:Se:H | $9.8 \times 10^{16}$ | $1.1 \times 10^3$ |
| | $6.2 \times 10^{17}$ | $2.0 \times 10^2$ |

TABLE II

| Alloys | Film Composition (atomic percent) | $\sigma_{light}/\sigma_{dark}$ |
|---|---|---|
| a-Si:H | — | $>10^4$ |
| a-Si:Se:H | Se = 4.0 | 1500 |
| a-Si:Ga:C:H | Ga = 4.2 | 6 |
| a-Si:Al:C:H | Al = 4.3 | 9 |

What is claimed is:

1. A hydrogenated amorphous silicon alloy consisting essentially of Si:M:H, where M is a member selected from the group consisting of Se, P, Mg, Zn, Cd, Fe, and Ni.

2. An alloy of claim 1, wherein said alloy exhibits an optical bandgap in the range from about 1.8 eV to about 2.1 eV.

3. The alloy of claim 2, wherein the alloy is Si:Se:H.

4. The alloy of claim 1, wherein the content of M is in the range from about 0.25 at. % to about 30 at. %, and the content of H is in the range from about 1 at. % to about 40 at. %.

5. The alloy of claim 1, wherein said alloy forms a semiconductive film.

6. An alloy of claim 1, wherein said alloy exhibits an optical bandgap in the range from about 1.0 eV to about 1.55 eV.

7. A hydrogenated amorphous silicon alloy consisting essentially of Si:M:H, where M is a member selected from the group consisting of Ga, Se, P, Mg, Zn, Cd, Fe, and Ni, produced by subjecting a mixed gas comprising a gas-phase alloy element compound and gas-phase silicon, to plasma enhanced chemical vapor deposition (PECVD) in a reaction zone, wherein the reaction pressure is in the range from about 200 mTorr to about 1800 mTorr, the temperature of the substrate is in the range from about 150° C. to about 450° C., and the rf power density is in the range from about 0.1 W/cm$^2$ to about 15 W/cm$^2$.

8. The alloy of claim 7, wherein said mixed gas is subjected to PECVD in a reaction zone enriched in a third gas.

9. The alloy of claim 8, wherein said third gas is a member selected from the group consisting of hydrogen, fluorine, an inert gas, and a combination of hydrogen and one or more gases.

10. The alloy of claim 9, wherein said third gas is added in a ratio of at least 5 parts third gas to 1 part mixed gas.

11. The alloy of claim 7, wherein said reaction pressure is in the range from about 500 mTorr to about 700 mTorr.

12. The alloy of claim 11, wherein said reaction pressure is in the range from about 250 mTorr to about 350 mTorr.

13. The alloy of claim 7, wherein said hydrogenated amorphous silicon alloy has an optical bandgap in the range from about 1.8 eV to about 2.1 eV.

14. The alloy of claim 7, wherein said hydrogenated amorphous silicon alloy has an optical bandgap in the range from about 1.0 eV to about 1.55 eV.

15. The alloy of claim 7, wherein the content of M is in the range from about 0.25 at. % to about 30 at. %, and the content of R1 is in the range from about 1 at. % to about 40 at. %.

16. The alloy of claim 7 wherein said gas-phase alloy element compound is selected from the group consisting of trimethyl aluminum, trimethyl gallium, triethyl aluminum, triethyl gallium and hydrogen selenide.

17. The alloy of claim 7, wherein said gas-phase silicon is selected from the group consisting of silane and disilane.

18. The alloy of claim 7, wherein said substrate temperature is in the range from about 250° C. to about 375° C.

19. The alloy of claim 7, wherein said rf power density is in the range from about 0.1 W/cm$^2$ to about 10 W/cm$^2$.

20. A hydrogenated amorphous silicon alloy consisting essentially of Si:M:C:H, where M is a member selected from the group consisting of Al, Ga, As, Se, P, Mg, Zn, Cd, Fe, and Ni.

21. An alloy of claim 20, wherein said alloy exhibits an optical bandgap in the range from about 1.0 eV.

22. The alloy of claim 21, wherein said alloy is Si:Ga:C:H.

23. The alloy of claim 20 wherein the alloy is Si:Ga:C:H.

24. An alloy of claim 20, wherein said alloy exhibits an optical bandgap in the range from about 1.8 eV to about 2.1 eV.

25. The alloy of claim 20, wherein the content of M is in the range from about 0.25 at. % to about 30 at. %, and the content of C:H is in the range from about 1 at. % to about 40 at. %.

26. The alloy of claim 20, wherein said alloy forms a semiconductive film.

27. A hydrogenated amorphous silicon alloy consisting essentially of Si:M:C:H, where M is a member selected from the group consisting of Al, As, Ga, Se, P, Mg, Zn, Cd, Fe, and Ni, produced by subjecting a mixed gas comprising a gas-phase alloy element compound and gas-phase silicon, to plasma enhanced chemical vapor deposition (PECVD) in a reaction zone, wherein the reaction pressure is in the range from about 200 mTorr to about 1800 mTorr, the temperature of the substrate is in the range from about 150° C. to about 450° C., and the rf power density is in the range from about 0.1 W/cm$^2$ to about 15 W/cm$^2$.

28. The alloy of claim 27, wherein the content of M is in the range from about 0.25 at. % to about 30 at. %, and the content of C:H is in the range from about 1 at. % to about 40 at. %.

29. The alloy of claim 27, wherein said hydrogenated amorphous silicon alloy has an optical bandgap in the range from about 1.8 eV to about 2.1 eV.

30. The alloy of claim 27, wherein said hydrogenated amorphous silicon alloy has an optical bandgap in the range from about 1.0 eV to about 1.55 eV.

31. The alloy of claim 27, wherein said gas-phase alloy element compound is selected from the group consisting of trimethyl aluminum, trimethyl gallium, triethyl aluminum, triethyl gallium and hydrogen selenide.

32. The alloy of claim 27, wherein said gas-phase silicon is selected from the group consisting of silane and disilane.

33. The alloy of claim 27, wherein said reaction pressure is in the range from about 500 mTorr to about 700 mTorr.

34. The alloy of claim 27, wherein said substrate temperature is in the range from about 250° C. to about 375° C.

35. The alloy of claim 27, wherein said rf power density is in the range from about 0.1 W/cm$^2$ to about 10 W/cm$^2$.

36. The alloy of claim 27, wherein said mixed gas is subjected to PECVD in a reaction zone enriched in a third gas.

37. A method for preparing a hydrogenated amorphous silicon alloy as a thin semiconductive film which comprises combining a gas-phase alloy element compound of structure M:R2, where M is selected from the group consisting of Al, Se, Ga, B, P, As, Mg, Zn, Cd, Fe, and Ni and R2 is hydrogen or a hydrocarbon derivative, and gas-phase silicon, to form a mixed gas and subjecting said mixed gas to plasma enhanced chemical vapor deposition (PECVD) in a reaction zone such that the alloy is deposited on a substrate as a thin film, wherein the reaction pressure is in the range from about 200 mTorr to about 1800 mTorr, the temperature of the substrate is in the range from about 150° C. to about 450° C., and the rf power density is in the range from about 0.1 W/cm$^2$ to about 15 W/cm$^2$.

38. The alloy of claim 37, wherein said mixed gas is subjected to PECVD in a reaction zone enriched in a third gas.

39. The method of claim 38, wherein said third gas is a member selected from the group consisting of: hydrogen, fluorine, an inert gas, and a combination of hydrogen and one or more gases.

40. The alloy of claim 38, wherein said third gas is added in a ratio of at least 5 parts third gas to 1 part mixed gas.

41. The method of claim 37, wherein said hydrogenated amorphous silicon alloy is a member selected from the group consisting of Si:Al:C:H, Si:Se:H and Si:Ga:C:H.

42. The method of claim 37, wherein said gas-phase silicon is selected from the group consisting of silane and disilane.

43. The method of claim 37, wherein said reaction pressure is in the range from about 500 mTorr to about 700 mTorr.

44. The method of claim 37, wherein said substrate temperature is in the range from about 250° C. to about 270° C.

45. The method of claim 37, wherein said rf power density is in the range from about 0.1 W/cm$^2$ to about 10 W/cm$^2$.

46. A hydrogenated amorphous silicon alloy prepared by the method of claim 37.

47. A semiconductive film prepared by the method of claim 37.

* * * * *